(12) United States Patent
Nagashima et al.

(10) Patent No.: US 6,892,796 B1
(45) Date of Patent: May 17, 2005

(54) APPARATUS AND METHOD FOR MOUNTING A POWER MODULE

(75) Inventors: James Nagashima, Cerritos, CA (US); Terence G. Ward, Redondo Beach, CA (US)

(73) Assignee: General Motors Corporation, Detroit, MI (US)

( * ) Notice: Subject to any disclaimer, the term of this patent is extended or adjusted under 35 U.S.C. 154(b) by 0 days.

(21) Appl. No.: 09/511,292

(22) Filed: Feb. 23, 2000

(51) Int. Cl.$^7$ .............................................. H05K 7/20
(52) U.S. Cl. ..................................... 165/80.4; 361/699
(58) Field of Search .............................. 165/80.4, 80.3, 165/185; 361/699; 257/718, 719, 726, 727

(56) References Cited

U.S. PATENT DOCUMENTS

| | | | | |
|---|---|---|---|---|
| 2,942,165 A | * | 6/1960 | Jackson et al. | 165/80.4 X |
| 5,001,548 A | * | 3/1991 | Iversen | 165/80.3 X |
| 5,006,924 A | * | 4/1991 | Frankeny et al. | 165/80.4 X |
| 5,099,311 A | * | 3/1992 | Bonde et al. | 165/80.4 X |
| 5,150,274 A | * | 9/1992 | Okada et al. | 165/80.4 X |
| 5,349,498 A | * | 9/1994 | Tanzer et al. | 361/689 |
| 5,436,798 A | * | 7/1995 | Wieland, Jr. | 257/719 X |
| 5,453,911 A | * | 9/1995 | Wolgemuth et al. | 165/80.4 X |
| 5,458,189 A | * | 10/1995 | Larson et al. | 165/104.33 |
| 5,521,439 A | * | 5/1996 | Casati et al. | 257/719 X |
| 5,804,875 A | * | 9/1998 | Remsburg et al. | 257/719 X |
| 5,870,823 A | * | 2/1999 | Bezama et al. | 165/80.4 X |
| 5,886,870 A | * | 3/1999 | Omori | 165/80.3 X |
| 6,020,597 A | * | 2/2000 | Kwak | 257/726 |
| 6,047,765 A | * | 4/2000 | Zhan | 165/80.3 |
| 6,055,154 A | * | 4/2000 | Azar | 165/80.3 X |

FOREIGN PATENT DOCUMENTS

SU 0438155 * 7/1974

* cited by examiner

Primary Examiner—Allen J. Flanigan
(74) Attorney, Agent, or Firm—Anthony Luke Simon

(57) ABSTRACT

A power module with heat sources wherein the heat is dissipated by a heat sink. The heat sink includes a manifold with coolant flowing therein. An opening on the manifold enables the coolant to come in direct contact with a base plate of the power module. The power module being retained on the heat sink by a plurality of spring clips.

9 Claims, 2 Drawing Sheets

APPARATUS AND METHOD FOR MOUNTING A POWER MODULE

TECHNICAL FIELD

The present invention relates generally to a method and apparatus for mounting a power module and, more particularly, to clip fasteners for securely mounting a power module to a heat sinking surface or medium.

BACKGROUND OF THE INVENTION

The usual hybrid power modules (HPM) in power inverter for motor drives is well known. The power modules include associated power switches and other related functions. A common method of mounting these devices is by inserting a screw in each of the mounting holes provided at each corner thereof with the screw engaging threaded holes in a chassis. These power modules generate excessive heat and therefore include a thermally conductive baseplate to dissipate the excessive heat. The baseplate is typically a metallic plate in thermal communication with the power switches of the module.

It is also known for a hybrid power module to be mounted over an opening of a fluid manifold so that liquid coolant flowing through the manifold comes into direct contact with the coolant for cooling the power module. This arrangement has the advantage of a more efficient cooling than using ambient air. The environment of the power module and/or the ambient air surrounding the power module typically does not provide efficient cooling. The baseplate of the power module is sealed to the coolant manifold by an O-ring seal to prevent coolant from leaking from the manifold. Accordingly, a consistent force across each edge of the module is desired to ensure that the O-ring does not leak over its design life and environment.

Typically, the power module is mounted to the manifold by four bolts at the corners of the power module (through the aforementioned mounting holes). The bolts pass through respective mounting holes in the baseplate and tightened within threaded holes in the manifold. The long space between mounting holes located at the corners allows the center portion of the edge of the baseplate to deflect. This deflection can cause a leak. The base plate has also been provided with a plurality of mounting holes intermediate the corner holes to prevent the deflection of the baseplate. While the additional mounting holes allow the power module to be securely mounted to the cooling manifold, this configuration increases the cost and labor to mount the power module. In addition, the intermediate mounting holes take up valuable space which could be used to mount devices or reduce the size of the power module.

SUMMARY OF THE INVENTION

It is therefore, a primary object of the present invention to provide a novel apparatus and method for mounting power modules. The power module is mounted over an opening of a fluid manifold so that liquid coolants flowing through the manifold comes into direct contact with the coolant for cooling the power module. As in the prior art, this arrangement has the advantage of a more efficient cooling than using ambient air. The environment of the power module and/or the ambient air surrounding the power module typically does not provide efficient cooling. The power module includes a thermally conductive baseplate to dissipate the excessive heat generated during operation. The baseplate of the power module is sealed to the coolant manifold by an O-ring seal to prevent coolant from leaking from the manifold. A consistent force across each edge of the module is maintained by a plurality of connecting elements to ensure that the O-ring does not leak over its design life and environment.

BRIEF DESCRIPTION OF THE DRAWINGS

The present invention will now be described, by way of example only, with reference to the accompanying drawings in which.

DETAILED DESCRIPTION OF THE INVENTION

Figure 1:
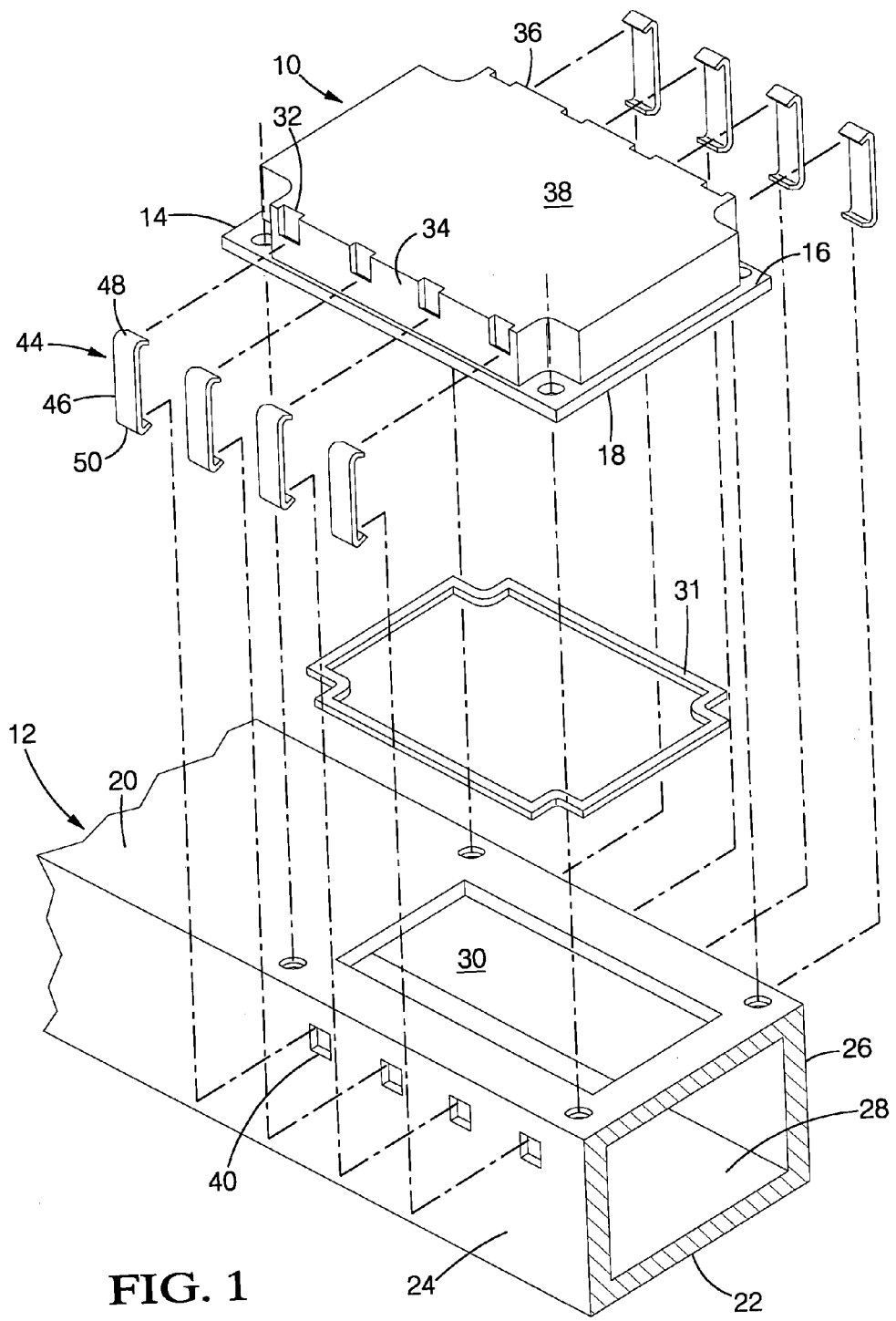
FIG. 1 is an exploded view of a power module mounted to a cooling manifold embodying the present invention.
Figure 2:
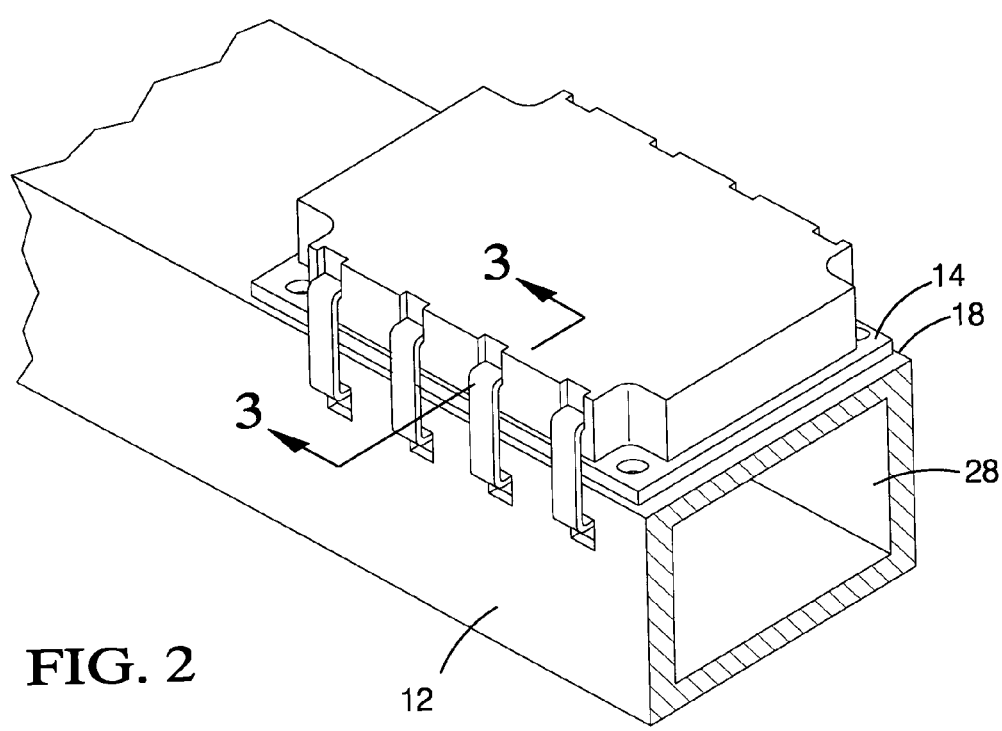
FIG. 2 is a perspective view of the power module with a baseplate, a cover of the baseplate, and a manifold of FIG. 1.
Figure 3:
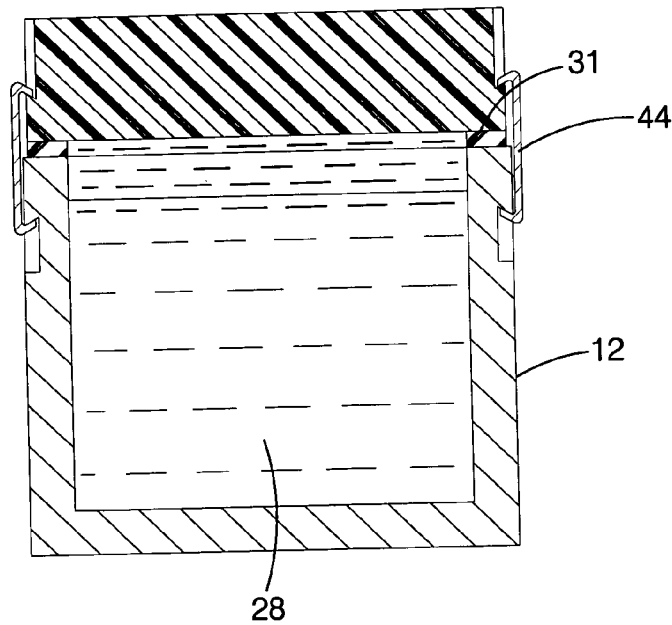
FIG. 3 is a cross sectional view of power module of FIG. 2 taken along line 3.

Referring to FIG. 1-3, a hybrid power module assembly, generally designated 10 is mounted to a cooling manifold or heat sinking member 12 wherein liquid coolant flows. While a hybrid power module is illustrated, one skilled in the art will recognize that the present invention may apply to any electronic device that requires cooling. The hybrid power module includes electronic circuit/components thermally connected to a generally rectangular baseplate 14. The baseplate 14 having an upper surface 16 and lower surface 18. The power module 10 is supported at the upper surface 16 of the baseplate 14. The manifold 12 has a top 20, a bottom 22 and sides 24 and 26 which define a channel 28 in which liquid coolant flows. A rectangular opening 30 is defined through the top 20 into channel 28 of the manifold 12. The baseplate 14 is fitted onto the rectangular opening 30 in the manifold 12 with a gasket (a sealing member) 31 disposed therebetween. It will be appreciated that the gasket could be of any type, including a stamped flat gasket. An O-ring gasket requires a groove for retention which can be cast into either the baseplate or the manifold. It is noted here that the rectangular shape is only exemplary and any suitable shape, preferably corresponding to the shape of the device requiring removal of heat, will suffice. Accordingly, the baseplate 14 and the opening 30 of the manifold may be of other shapes such as oval, round, or other suitable shapes. Indentations 32 are molded into sides 34 and 36 of a case 38 of power module assembly 10. Case 38 is preferably plastic and encloses the electronic circuits of the power module assembly 10.

A plurality of recesses 40 are formed in sides 24 and 26 of the manifold 12. Recesses 40 are aligned with indentations 32 to position power module assembly 10 on manifold 12 over opening 30. A plurality of connecting elements 44 retain power module assembly 10 on manifold 12. In an exemplary embodiment, connecting elements 44 are generally C-shaped spring clips having an elongated portion 46, an upper extension 48 and a lower extension 50. Also, these clips are preferably comprised of metal and are resilient whereby they have a spring retention force. These spring clips are preferably made using a metal stamping process, as such is well known, and provides for a low cost method of manufacturing. Each of these spring clips is installed by mounting one of the extensions, e.g., lower extension 50 in a recess 40 and a force is applied to the elongated portion 46 which causes the upper extension 48 to be urged outwardly (and angled upwardly) as it pushes against the side of the case 38 of the power module assembly 10 until extension 48 enters indentations 32, and snaps into place. These spring clips are uniformly distributed (located) along opposing sides of power module assembly 10, to provide a consistent force across each edge of the module.

As is best seen in FIGS. 2 and 3, the lower surface 18 of the baseplate 14 is in direct contact with the coolant (not shown) flowing within channel 28 of the manifold 12. It is this direct contact that sinks the heat away from the power module assembly 10 during operation thereof.

An advantage of the present invention is that this method of snap fitting the spring clip into the recesses does not require additional area on the baseplate. Further, the spring clips provide consistent pressure across each flange face for sealing. The clips are also low cost stampings similar to those used to clamp radiator housings together. Unlike screws or other threaded fasteners, the spring clips are self adjusting and will not loosen or back out over time. The spring clips also mitigate creep of joint materials. In addition, installation is simple since the spring clips can be accomplished by hand or with simple fixturing. This method can be used with spring clips alone or in combination with the corner mounting screws. While the immediate application is for direct liquid cooling, this invention can be used to mount modules to a standard heatsink with a thermal grease interface or the like.

It will be understood that a person skilled in the art may make modifications to the preferred embodiment shown herein within the scope and intent of the claims. While the present invention has been described as carried out in a specific embodiment thereof, it is not intended to be limited thereby but is intended to cover the invention broadly within the scope and spirit of the claims.

What is claimed is:

1. A cooling assembly comprising:
    a heat sinking member having a plurality of recesses defined therein; said heat sinking member receptive to liquid coolant flow;
    a power module disposed on said heat sinking member, said power module having a casing with a plurality of indentations therein, said indentations being positioned relative to said recesses to located said power module on said heat sinking member;
    a plurality of spring clip pairs, each of said spring clips having first and second extensions, one of said first and second extensions cooperating with a corresponding one of said recesses and the other one of said first and second extensions corresponding with a corresponding one of said indentations to retains said power module on said heat sinking member and to facilitate heat transfer during operation of said power module;
    and wherein each of said spring clips exerts a substantially equal force to retain said power module on said heat sinking member, whereby a substantially liquid proof seal may be formed between said power module and said heat sinking member.

2. The cooling assembly of claim 1, further comprising a sealing member.

3. The cooling assembly of claim 2, wherein the sealing member is a gasket.

4. The cooling assembly of claim 3, wherein said heat sinking member includes a channel defined therein for allowing coolant to flow therethrough.

5. The cooling assembly of claim 4, wherein the heat sinking member includes an opening leading to said channel to allow said power module to directly contact coolant flowing in said channel.

6. The cooling assembly of claim 1 wherein said heat sinking member is an elongated generally rectangular member.

7. The cooling assembly of claim 5, wherein said opening is generally rectangular.

8. The cooling assembly of claim 5, wherein said opening is generally rectangular.

9. The cooling assembly of claim 1, wherein said spring clips comprise generally C-shaped spring clips.

* * * * *